United States Patent
Kuo et al.

(10) Patent No.: US 9,859,137 B2
(45) Date of Patent: Jan. 2, 2018

(54) SUBSTRATE HEAT TREATMENT APPARATUS AND HEAT TREATMENT METHOD

(71) Applicant: Taiwan Semiconductor Manufacturing Co., Ltd., Hsin-Chu (TW)

(72) Inventors: Chun-Cha Kuo, Taipei (TW); Wen-Long Lee, Hsinchu (TW); Tzu-Chien Cheng, Bade (TW); Ding-I Liu, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 21 days.

(21) Appl. No.: 14/291,555

(22) Filed: May 30, 2014

(65) Prior Publication Data

US 2015/0348847 A1    Dec. 3, 2015

(51) Int. Cl.
| | |
|---|---|
| *H01L 21/67* | (2006.01) |
| *H01L 29/66* | (2006.01) |
| *H01L 21/02* | (2006.01) |
| *H01L 21/28* | (2006.01) |
| *H01L 21/3213* | (2006.01) |
| *H01L 29/49* | (2006.01) |
| *H01L 29/51* | (2006.01) |
| *H01L 21/8238* | (2006.01) |

(52) U.S. Cl.
CPC .. *H01L 21/67109* (2013.01); *H01L 21/02282* (2013.01); *H01L 21/02318* (2013.01); *H01L 21/28088* (2013.01); *H01L 21/32139* (2013.01); *H01L 21/67115* (2013.01); *H01L 29/66545* (2013.01); *H01L 21/28185* (2013.01); *H01L 21/6715* (2013.01); *H01L 21/823842* (2013.01); *H01L 29/4966* (2013.01); *H01L 29/517* (2013.01)

(58) Field of Classification Search
CPC ......... H01L 21/02318; H01L 21/67109; H01L 21/02282; H01L 21/28088
See application file for complete search history.

(56) References Cited

U.S. PATENT DOCUMENTS

| | | | | |
|---|---|---|---|---|
| 5,831,249 A * | 11/1998 | Rohner | ............. | H01L 21/67248 219/390 |
| 6,073,501 A * | 6/2000 | Rohner | .................. | G01N 21/94 73/865.8 |
| 6,245,666 B1 * | 6/2001 | Ko | .................... | H01L 21/32136 257/E21.311 |
| 6,492,621 B2 * | 12/2002 | Ratliff | ................... | C23C 16/455 118/724 |
| 6,531,389 B1 * | 3/2003 | Shue | ................. | H01L 21/76802 257/E21.577 |
| 2003/0148631 A1 * | 8/2003 | Kuo | .................. | H01L 21/02137 438/782 |

(Continued)

*Primary Examiner* — Matthew Reames
(74) *Attorney, Agent, or Firm* — McClure, Qualey & Rodack, LLP

(57) ABSTRACT

A method for forming a semiconductor device structure and an apparatus for heating a semiconductor substrate are provided. The method includes spin coating a material layer over a semiconductor substrate. The method also includes heating the material layer by using a first heater above the semiconductor substrate and a second heater below the semiconductor substrate.

20 Claims, 8 Drawing Sheets

(56) References Cited

U.S. PATENT DOCUMENTS

2007/0243317 A1* 10/2007 Du Bois ............. C23C 16/4583
           427/98.9
2013/0102142 A1*  4/2013 Lee ................. H01L 21/823807
           438/591

* cited by examiner

SUBSTRATE HEAT TREATMENT APPARATUS AND HEAT TREATMENT METHOD

BACKGROUND

Semiconductor devices are used in a variety of electronic applications, such as personal computers, cell phones, digital cameras, and other electronic equipment. The semiconductor devices are fabricated by sequentially depositing insulating or dielectric layers, conductive layers, and semiconductor layers over a semiconductor substrate, and patterning the various material layers using patterning processes including photolithography and etching operations to form circuit components and elements on the semiconductor substrate.

In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For example, the patterning process has become more difficult to perform since the feature sizes are reduced.

Therefore, it is a challenge to improve the quality of the patterning process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
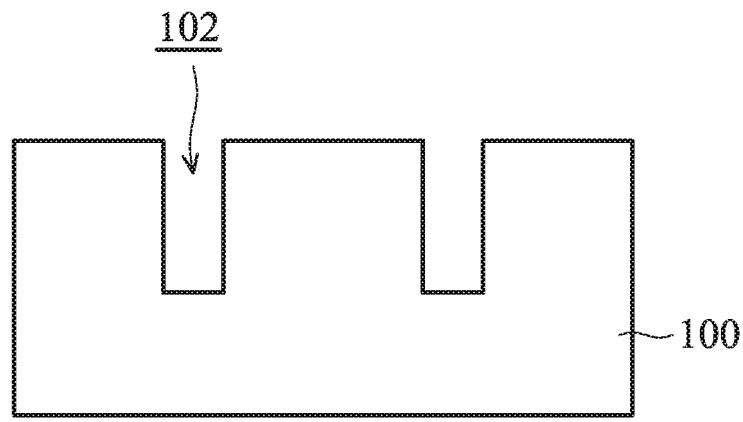
FIGS. 1A-1D are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1D are cross-sectional views of various stages of a process for forming a semiconductor device structure, in accordance with some embodiments. As shown in FIG. 1A, a semiconductor substrate 100 is provided. In some embodiments, the semiconductor substrate 100 is a bulk semiconductor substrate, such as a silicon wafer. In some other embodiments, the semiconductor substrate 100 includes other elementary semiconductors such as germanium, or it includes a compound semiconductor. The compound semiconductor may include silicon carbide, gallium arsenide, indium arsenide, indium phosphide, other suitable compound semiconductors, or a combination thereof. In some embodiments, the semiconductor substrate 100 includes a semiconductor-on-insulator (SOI) substrate. The SOI substrate may be fabricated using a separation by implantation of oxygen (SIMOX) process, wafer bonding process, other applicable methods, or a combination thereof.

As shown in FIG. 1A, one or more recesses 102 are formed in or on the semiconductor substrate 100, in accordance with some embodiments. For example, the semiconductor substrate 100 is partially removed to form the recesses 102. In some embodiments, the recesses 102 are formed using a photolithography process and an etching process.

Figure 1B:
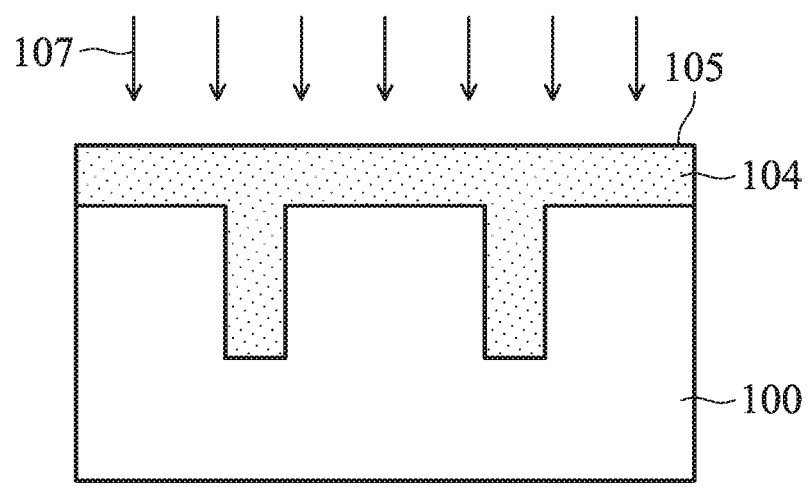

As shown in FIG. 1B, a material layer 104 is deposited over the semiconductor substrate 100, in accordance with some embodiments. In some embodiments, the material layer 104 fills the recesses 102. In some embodiments, the material layer 104 is a dielectric material. In some other embodiments, the material layer 104 includes a metal material, a semiconductor material, other suitable materials, or a combination thereof. In some embodiments, the material layer 104 is made of a material containing silicon oxide. In some embodiments, the material layer 104 includes silicon oxide doped with other elements. The material layer 104 may include silicon oxide doped with carbon, nitrogen, sulfur, phosphor, other suitable elements, or a combination thereof.

Figure 2:
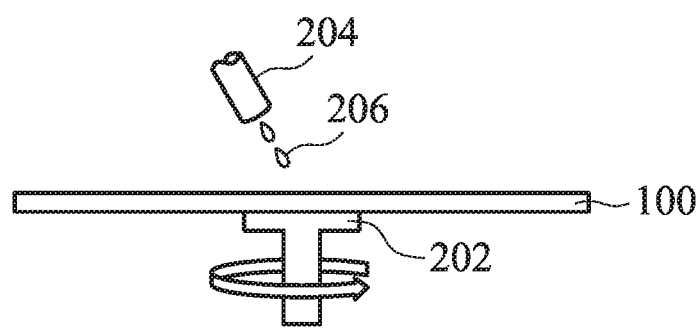
FIG. 2 is a cross-sectional view of a spin coating apparatus, in accordance with some embodiments.

In some embodiments, the material layer 104 is deposited using a spin-on process (or a spin coating process). FIG. 2 is a cross-sectional view of a spin coating apparatus, in accordance with some embodiments. The spin coating apparatus may be used to form the material layer 104 over the semiconductor substrate 100. In some embodiments, the spin coating apparatus includes a substrate holder 202 and a liquid provider 204. In some embodiments, the substrate holder 202 includes a vacuum chunk and a rotary shaft. The substrate holder 202 is used to suck and fix the semiconductor substrate 100 and rotate the semiconductor substrate 100.

A film-forming solution (or film-forming liquid) 206 is provided onto the surface of the semiconductor substrate 100 by the liquid provider 204. In some embodiments, the film-forming solution is a silicon-containing organic solution or the like. For example, the film-forming solution 206 is dispensed onto the semiconductor substrate 100 by a nozzle of the liquid provider 204 before or during the semiconductor substrate 100 is spun by the substrate holder 202. As a result, the material layer 104 is formed over the semiconductor substrate 100 and fills the recesses 102, as shown in FIG. 1B. In some embodiments, the material layer 104 has a substantially planar surface 105. The material layer 104 over the semiconductor substrate 100 has a thickness which may be in a range from about 300 Å to about 3000 Å.

Afterwards, the material layer 104 will be patterned. Before the material layer 104 is patterned, a heat treatment is performed to the material layer 104 to facilitate the subsequent patterning processes. In some embodiments, the semiconductor substrate 100 is transferred into an apparatus for providing heat treatment to the semiconductor substrate 100 and the material layer 104. FIGS. 3A-3D are cross-sectional views of apparatuses for heating a semiconductor substrate 100, in accordance with some embodiments. The material layer 104 can be evenly heated to facilitate the subsequent patterning processes. The details of the apparatus will be described in more detail later.

As shown in FIG. 1B, a rinsing process 107 is performed on the surface 105 of the material layer 104, in accordance with some embodiments. In some embodiments, a rinse solution is applied over the material layer 104 to rinse the material layer 104. The rinse solution may include a solution containing propylene glycol monomethyl etheracetate (PGMEA), a solution containing propylene monomethyl ether (PGME), other suitable solutions, or a combination thereof. In some embodiments, the rinse solution is applied over the material layer 104 using a spin-on process (or a spin coating process).

Figure 1C:
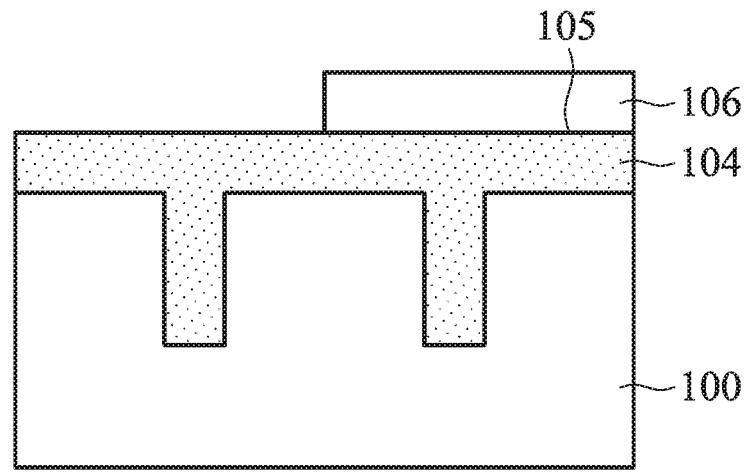

As shown in FIG. 1C, a patterned photosensitive layer 106 is formed over the material layer 104, in accordance with some embodiments. In some embodiments, the photoresist layer 106 is made of a photoresist material. In some embodiments, the photosensitive layer 106 is formed using a photolithography process. The photolithography process may include photoresist coating (e.g., spin-on coating), soft baking, mask aligning, exposure, post-exposure baking, developing the photoresist, rinsing, drying (e.g., hard baking), other suitable processes, or a combination thereof. For example, a photoresist layer is deposited over the material layer 104. Afterwards, the photoresist layer is exposed and developed to form the patterned photosensitive layer 106.

Figure 1D:
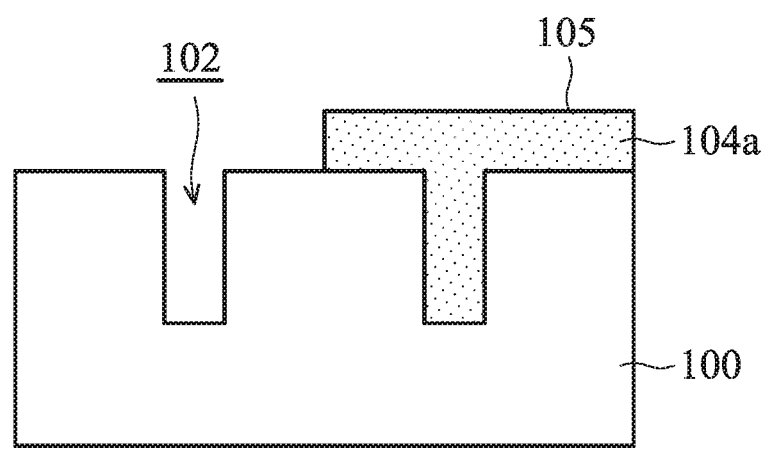

As shown in FIG. 1D, the material layer 104 is patterned to form a patterned material layer 104a, in accordance with some embodiments. The photosensitive layer 106 shown in FIG. 1C is used as a mask, and the exposed portion of the material layer 104 is removed. In some embodiments, the material layer 104 is partially removed using a wet etching process, a dry etching process, other applicable processes, or a combination thereof. For example, a suitable solution may be used to remove the exposed portion of the material layer 104. Afterwards, the photosensitive layer 106 is removed. In some embodiments, the material layer 104a is completely removed from one of the recesses 102, as shown in FIG. 1D.

As mentioned above, before the photosensitive layer 106 is formed, a heat treatment is performed to the material layer 104 to facilitate the patterning processes. In some cases, the material layer 104 may not be heated adequately. In some cases, the semiconductor substrate 100 is disposed over a hot plate (not shown) to heat the material layer 104. If the material layer 104 is not heated sufficiently, the surface of the material layer 104 may not be dried enough. A portion of the material layer 104 may be dissolved by the rinse solution during the rinsing process 107 as shown in FIG. 1B. The dissolved portion of the material layer 104 is moved to a peripheral region of the semiconductor substrate 100 due to the centrifugal force generated during the rinsing process 107. As a result, the portion of the material layer 104 positioned over the peripheral region is thicker than the portion of the material layer 104 positioned over a central region of the semiconductor substrate 100. Therefore, the thicker portion of the material layer 104 positioned over the peripheral region may not be patterned successfully and/or precisely. On the other hand, if the material layer 104 is overheated, a portion of the material layer 104, such as that positioned near the bottoms of the recesses 102, may become difficult to remove. It is thus desirable to evenly and adequately heat the material layer 104 to ensure a precise and successful patterning of the material layer 104.

Figure 3A:
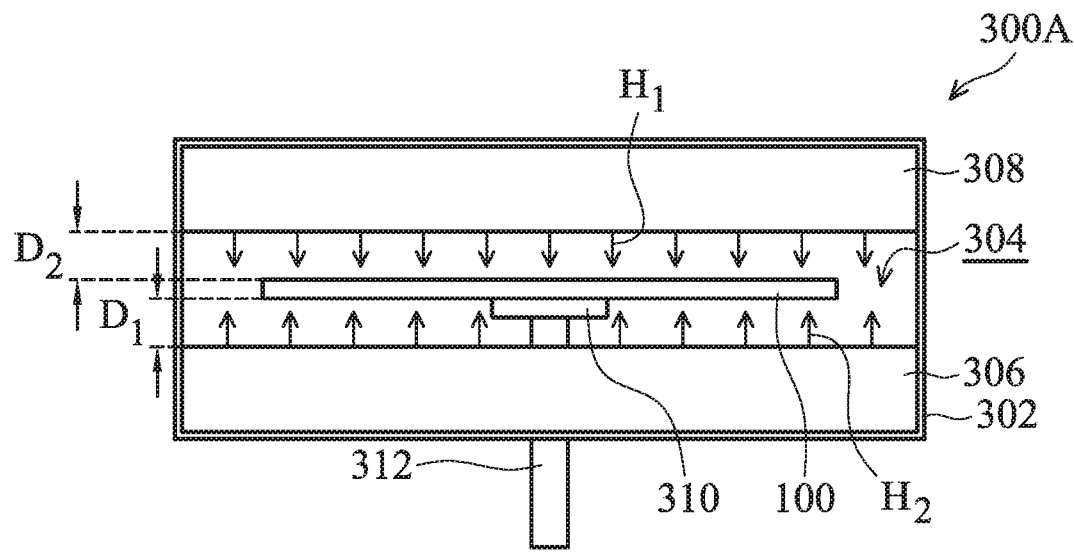
FIGS. 3A-3D are cross-sectional views of apparatuses for heating a semiconductor substrate, in accordance with some embodiments.

FIG. 3A is a cross-sectional view of an apparatus 300A for heating a semiconductor substrate, in accordance with some embodiments. In some embodiments, the apparatus 300A includes heaters 306 and 308 and a substrate holder 310. In some embodiments, the apparatus 300A includes a closed chamber 302. The heaters 306 and 308 and the substrate holder 310 are positioned in the closed chamber 302. The closed chamber 302 is configured to thermally isolate the space inside the closed chamber 302 from the outside environment. The substrate holder 310 is configured to hold a substrate, such as the semiconductor substrate 100. In some embodiments, the substrate holder 310 connects with a shaft 312. In some embodiments, the semiconductor substrate 100 is transferred into the closed chamber 302 after the material layer 104 is deposited and before the rinsing process 107 is performed. The semiconductor substrate 100 is fixed on the substrate holder 310, as shown in FIG. 3A.

In some embodiments, both the heaters 308 and 306 are configured to heat the semiconductor substrate 100. In some embodiments, each of the heaters 308 and 306 includes one or more electric heater coils. In some embodiments, each of the heaters 308 and 306 includes an electric heater coil, a light heater, other applicable heaters, or a combination thereof. The light heater may include an ultraviolet (UV) light source, an infrared light source, other suitable radiation sources, or a combination thereof.

In some embodiments, the substrate holder 310 keeps the semiconductor substrate 100 at a position spaced from the heaters 306 and 308 by distances $D_1$ and $D_2$, respectively. For example, the distances $D_1$ and $D_2$ are vertical distances between the semiconductor substrate 100 and the heaters 306 and 308, respectively. The semiconductor substrate 100 is not in direct contact with the heaters 306 and 308. Each of the distances $D_1$ and $D_2$ should not be so short that the semiconductor substrate 100 is in danger of being overheated. Each of the distances $D_1$ and $D_2$ should not be so long that the semiconductor substrate 100 is not heated sufficiently. In some embodiments, the distances $D_1$ and $D_2$ are substantially the same. Each of the distances $D_1$ and $D_2$ may be in a range from about 0.5 cm to about 100 cm.

In some embodiments, the semiconductor substrate 100 and the material layer 104 are heated simultaneously by both of the heaters 308 and 306 above and below the semiconductor substrate 100. As shown in FIG. 3A, thermal energy $H_1$ and $H_2$ are provided to the semiconductor substrate 100 from opposite directions, in accordance with some embodiments. Because the semiconductor substrate 100 is separated from the heaters 306 and 308 and heated from two opposite directions, the material layer 104 is heated evenly and adequately. The surface 105 of the material layer 104 is dried enough to sustain the subsequent rinsing process 107. The material layer 104 is not overheated to ensure that no residue is left after the patterning process. In other words, both a surface portion and an inner portion of the material layer 104 are heated under substantially the same condition. Therefore, it is easier to ensure that the surface portion of the material layer 104 is dry enough and the inner portion of the material layer 104 is not overheated. As a result, a precise and successful patterning of the material layer 104 is achieved.

Embodiments of the disclosure have many variations. In some embodiments, the thermal energy $H_1$ and $H_2$ provided by the heaters 306 and 308 are substantially the same. In some other embodiments, the thermal energy $H_1$ is higher than the thermal energy $H_2$. In some other embodiments, the thermal energy $H_2$ is higher than the thermal energy $H_1$.

Figure 3B:
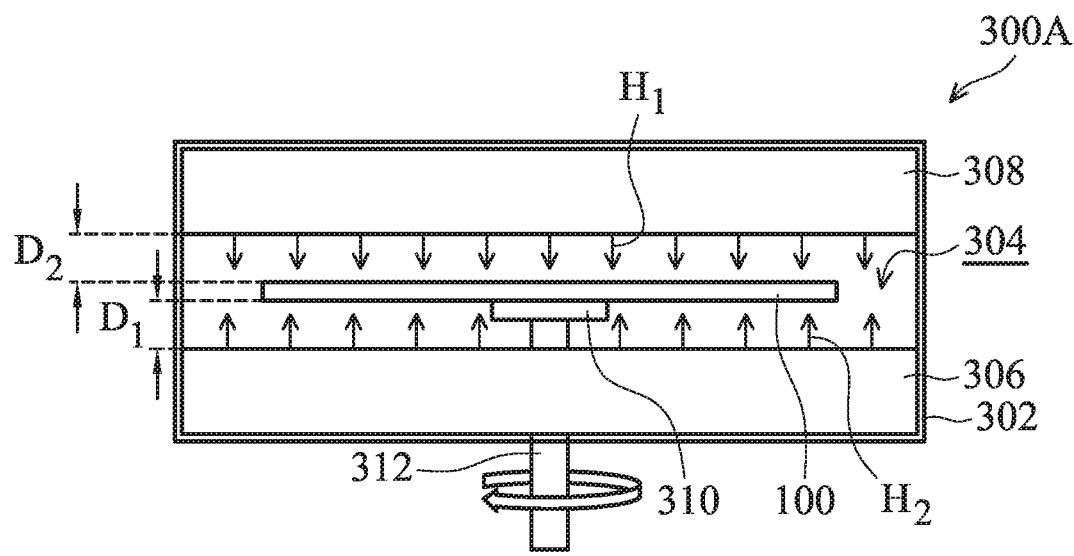

FIG. 3B is a cross-sectional view of the apparatus 300A, in accordance with some embodiments. In some embodiments, the shaft 312 is a rotary shaft which can rotate the substrate holder 310. In other words, the substrate holder 310 is a rotatable substrate holder. In some embodiments, the rotatable substrate holder 310 rotates the semiconductor substrate 100 while the semiconductor substrate 100 is heated or baked by the heaters 306 and 308. Because the semiconductor substrate 100 is rotated, the material layer 104 is heated or baked more evenly. Therefore, the quality of the subsequent patterning process may be improved further.

Figure 3C:
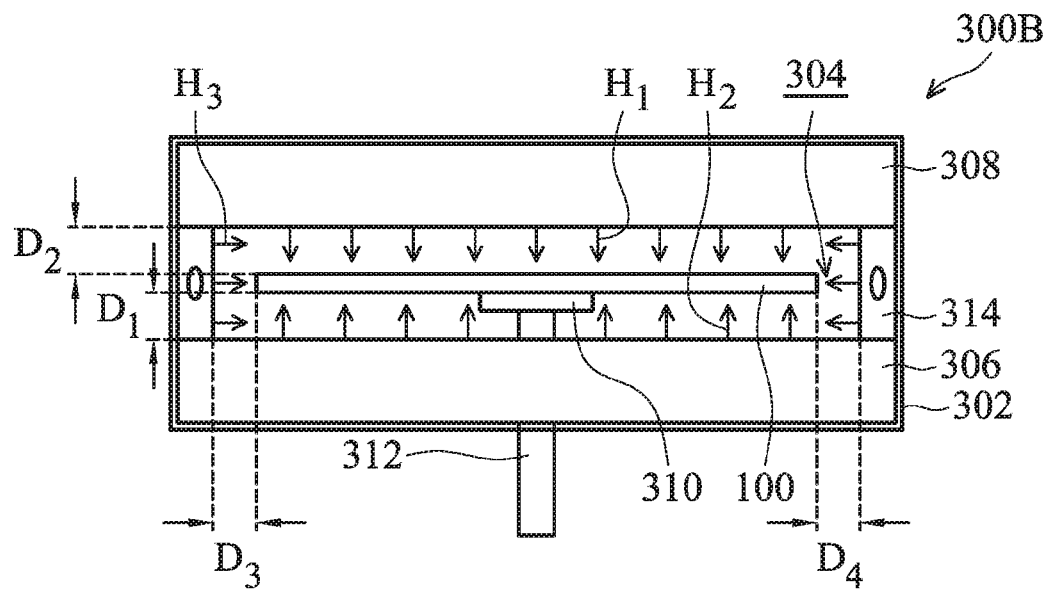

FIG. 3C is a cross-sectional view of an apparatus 300B for heating a semiconductor substrate, in accordance with some embodiments. The apparatus 300B is similar to the apparatus 300A. In some embodiments, the apparatus 300B further includes a heater 314 which surrounds the substrate holder 310. In some embodiments, the semiconductor substrate 100 is transferred into the closed chamber 302 after the material layer 104 is deposited and before the rinsing process 107 is performed. Afterwards, the semiconductor substrate 100 is fixed on the substrate holder 310. The heater 314 surrounds the periphery of the semiconductor substrate 100.

Figure 5:
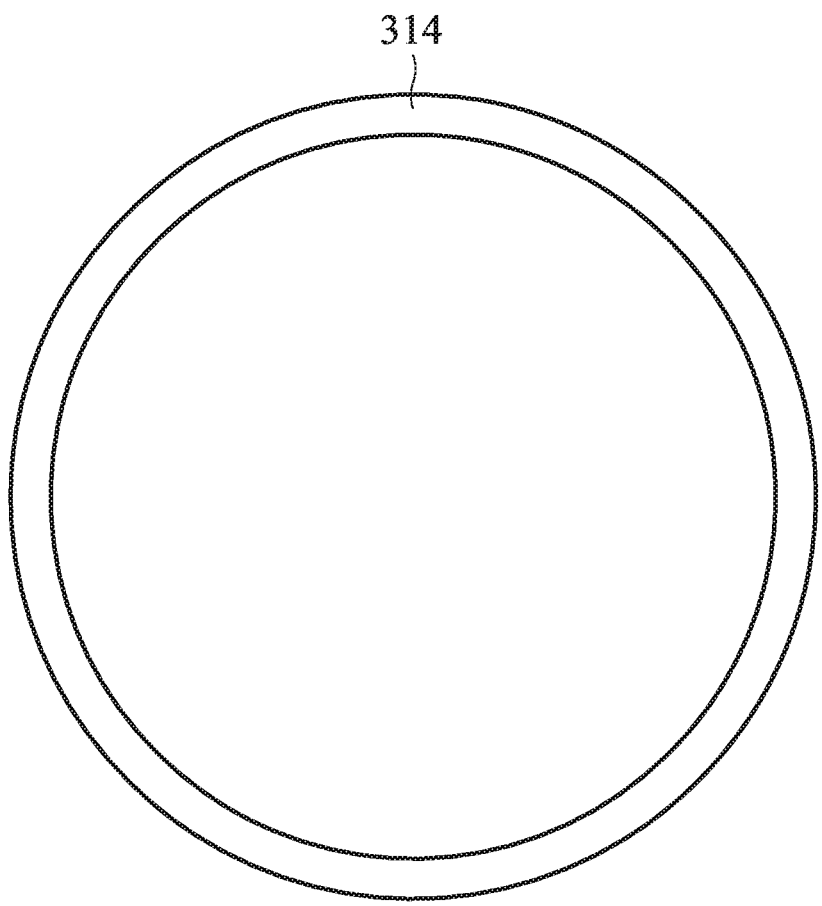
FIG. 5 is a top view of a heater of an apparatus for heating a semiconductor substrate, in accordance with some embodiments.

The heater 314 is configured to heat the semiconductor substrate 100 and the material layer 104. In some embodiments, the heater 314 is a ring-shaped heater. For example, a top view of the heater 314 is a circle ring, a square ring, a quadrangular ring, a triangular ring, or another ring with a suitable shape. FIG. 5 is a top view of a heater of an apparatus for heating a semiconductor substrate, in accordance with some embodiments. In some embodiments, the heater 314 is a circular ring surrounding the semiconductor substrate 100. In some embodiments, the heater 314 includes an electric heater coil, a light heater, other applicable heaters, or a combination thereof. The light heater may include an ultraviolet (UV) light source, an infrared light source, other suitable radiation sources, or a combination thereof.

In some embodiments, the semiconductor substrate 100 is secured by the substrate holder 310 to ensure the heater 314 is not in direct contact with the semiconductor substrate 100. The semiconductor substrate 100 is separated from the heater 314 by a distance $D_3$. The distance $D_3$ is, for example, a horizontal distance between the heater 314 and the edge of the semiconductor substrate 100. In some embodiments, the distance $D_3$ is substantially the same as the distance $D_1$ or $D_2$. The distance $D_3$ should not be so short that the semiconductor substrate 100 is in danger of being overheated. The distance $D_3$ should not be so long that the semiconductor substrate 100 is not heated sufficiently. The distance $D_3$ may be in a range from about 0.5 cm to about 100 cm.

In some embodiments, the material layer 104 is heated by the heater 314. In some embodiments, the material layer 104 is heated by the heaters 306, 308, and 314 simultaneously. As shown in FIG. 3C, thermal energy $H_1$, $H_2$, and $H_3$ is provided to the semiconductor substrate 100, in accordance with some embodiments. The semiconductor substrate 100 is separated from the heaters 306, 308, and 314 and thermal energy is provided evenly from almost all directions. The surface 105 of the material layer 104 is dried enough to sustain the subsequent rinsing process 107. The material layer 104 is not overheated to ensure that no residue is left after the patterning process. In other words, both a surface portion and an inner portion of the material layer 104 are heated under substantially the same condition. Therefore, it is easier to ensure that the surface portion of the material layer 104 is dry enough and the inner portion of the material layer 104 is not overheated. As a result, a precise and successful patterning of the material layer 104 is achieved.

Embodiments of the disclosure have many variations. In some embodiments, the thermal energy $H_1$, $H_2$, and $H_3$ provided by the heaters 306, 308, and 314 are substantially the same. In some other embodiments, the thermal energy $H_1$ is higher than the thermal energy $H_2$ or $H_3$. In some other embodiments, the thermal energy $H_2$ is higher than the thermal energy $H_1$ or $H_3$. In some other embodiments, the thermal energy $H_3$ is higher than the thermal energy $H_1$ or $H_2$. In some embodiments, the heater 314 starts to heat the material layer 104 after the material layer 104 has been heated by the heaters 306 and 308 for a while.

Figure 3D:
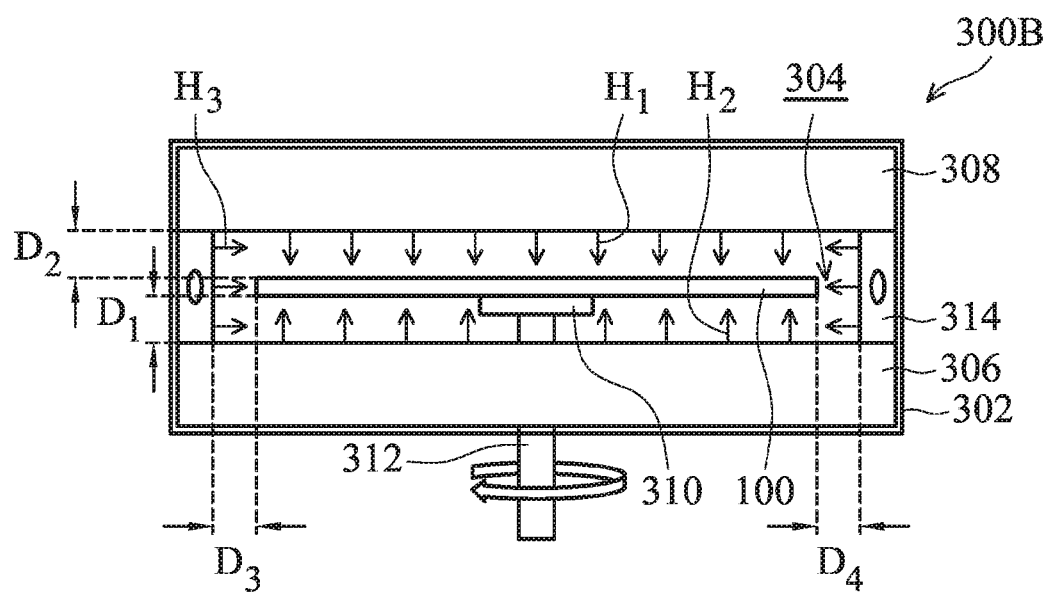

FIG. 3D is a cross-sectional view of the apparatus 300B, in accordance with some embodiments. In some embodiments, the shaft 312 is a rotary shaft which can rotate the substrate holder 310. In some embodiments, the rotatable substrate holder 310 rotates the semiconductor substrate 100 while the semiconductor substrate 100 is heated by the heaters 306, 308, and 314. Because the semiconductor substrate 100 is rotated, the material layer 104 is heated more evenly. Therefore, the quality of the subsequent patterning process may be further improved.

In accordance with some embodiments, the apparatus for heating a semiconductor substrate can be used in various stages of a semiconductor device manufacturing process. For example, the apparatus is used in a gate last process (or a replacement-gate process). FIGS. 4A-4D are cross-sectional views of various stages of a process for forming a semiconductor device structure, in accordance with some embodiments.

Figure 4A:
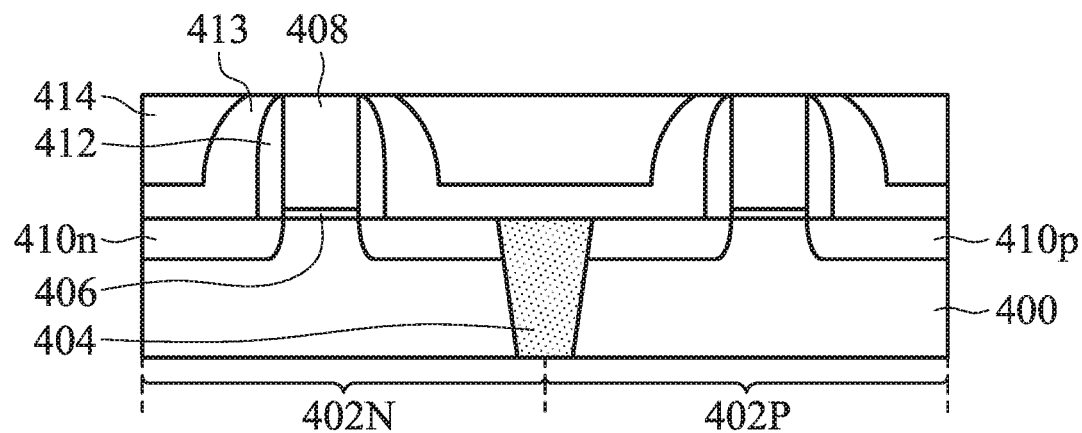
FIGS. 4A-4D are cross-sectional views of various stages of a process for forming a semiconductor device structure, in accordance with some embodiments.

As shown in FIG. 4A, a semiconductor substrate 400 is provided, in accordance with some embodiments. The semiconductor substrate 400 may be similar to the semiconductor substrate 100. In some embodiments, one or more isolation features 404 are formed in the semiconductor substrate 100 to isolate various active regions, such as regions 402N and 402P, from each other. In some embodiments, the isolation feature 404 is made of a dielectric material. The dielectric material may include silicon oxide, silicon nitride, silicon oxynitride, fluoride-doped silicate glass (FSG), a low-k dielectric material, other suitable dielectric materials, or a combination thereof. In some embodiments, the isolation features are formed using a shallow trench isolation (STI) process, a local oxidation of silicon (LOCOS) process, other applicable processes, or a combination thereof.

In some embodiments, the semiconductor substrate 100 is doped to form well regions (not shown). In some embodiments, the region 402N is designed to form an NMOS device, and the region 402P is designed to form a PMOS device. In these cases, ion implantation processes or other applicable processes are sequentially performed to form a P-well region and an N-well region in the regions 402N and 402P of the semiconductor substrate 100, respectively. An implantation mask may be used to assist in the ion implantation processes.

As shown in FIG. 4A, gate stacks are formed over the semiconductor substrate 400. Each of the gate stacks includes a gate dielectric layer 406 and a gate electrode 408. In some embodiments, the gate dielectric layer 406 is made of silicon oxide, and the gate electrode 408 is made of polysilicon. In some other embodiments, the gate dielectric layer 406 is made of a high-k material. In some embodiments, a dielectric layer and an electrode layer are deposited and patterned to form the gate stack.

In some embodiments, spacer elements 412 are formed over sidewalls of the gate stacks, as shown in FIG. 4A. The spacer elements 412 are made of, for example, silicon nitride, silicon oxynitride, silicon carbide, carbon-doped silicon nitride, silicon oxide, other suitable materials, or a combination thereof. In some embodiments, a spacer layer is deposited over the semiconductor substrate 400 and the gate stacks using a chemical vapor deposition (CVD) process, an atomic layer deposition (ALD) process, a physical vapor deposition (PVD) process, other applicable processes, or a combination thereof. Afterwards, an anisotropic etching process is used to partially remove the spacer layer. As a result, the spacer elements 412 are formed.

As shown in FIG. 4A, source/drain (S/D) regions 410n and 410p are sequentially formed in the semiconductor substrate 400, in accordance with some embodiments. For example, ion implantation processes are used to form the S/D regions 410n and 410p. In some embodiments, the S/D region 410n is an n-type doped region, and the S/D region 410p is a p-type doped region. In some embodiments, ion implantation processes or other applicable processes are sequentially performed to form the S/D region 410n and the S/D region 410p, respectively. An implantation mask may be used to assist in the ion implantation processes.

Afterwards, an etch stop layer 413 and a dielectric layer 414 are sequentially deposited over the semiconductor substrate 400 and the gate stacks, in accordance with some embodiments. The etch stop layer 413 and the dielectric layer 414 surround the gate stacks. In some embodiments, the etch stop layer 413 is made of silicon nitride. In some embodiments, the dielectric layer 414 is made of silicon oxide or other suitable low-k material. A CVD process or other applicable processes may be used to deposit the etch stop layer 413 and the dielectric layer 414. Then, a planarization process is performed to partially remove the etch stop layer 413 and the dielectric layer 414 until the gate electrodes 408 are exposed, as shown in FIG. 4A. The planarization process may include a chemical mechanical polishing (CMP) process, a mechanical grinding process, an etching process, other applicable processes, or a combination thereof.

Figure 4B:
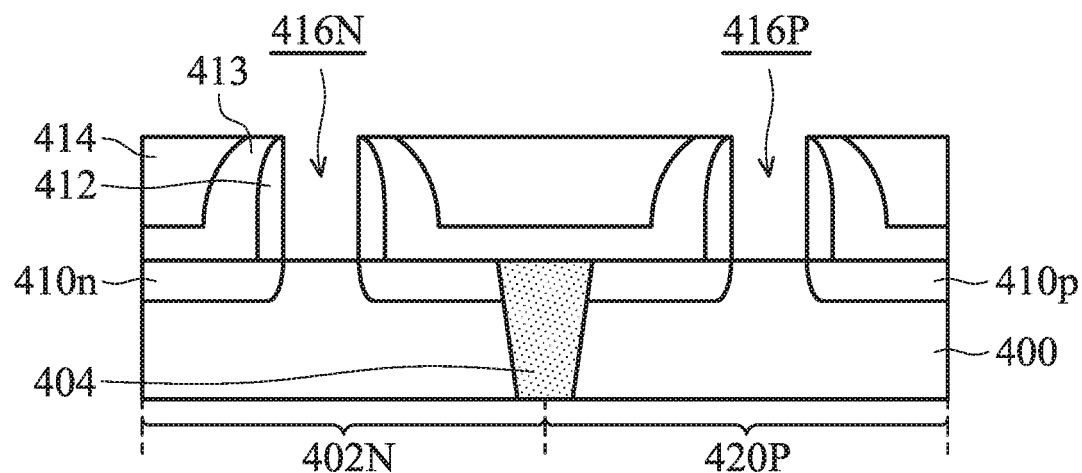

As shown in FIG. 4B, the gate electrodes 408 are removed to form recesses 416N and 416P, in accordance with some embodiments. In some embodiments, the gate dielectric layer 406 is also removed. In some embodiments, the recesses 416N and 416P expose the semiconductor substrate 400. For example, an etching process is used to remove the gate electrodes 408. In some embodiments, another etching process is used to remove the gate dielectric layer 406. In some other embodiments, the gate dielectric layer 406 is not removed.

Figure 4C:
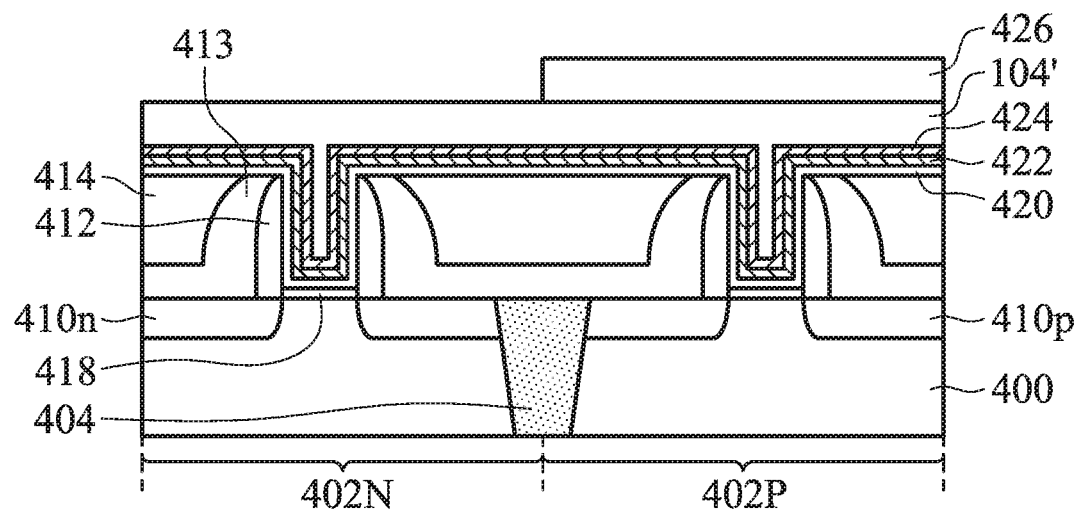

As shown in FIG. 4C, an interfacial layer 418 is formed over the bottom of the recesses 416N and 416P, in accordance with some embodiments. In some embodiments, the interfacial layer 418 is made of silicon oxide. In some embodiments, an interfacial material layer is deposited using a CVD process or other applicable processes. Afterwards, the interfacial material layer is patterned to form the interfacial layer 418. In some other embodiments, a thermal oxidation process is performed to form the interfacial layer 418 on the exposed surface of the semiconductor substrate 400.

As shown in FIG. 4C, a gate dielectric layer 420 is formed over sidewalls of the recesses 416N and 416P and the interfacial layer 418, in accordance with some embodiments. In some embodiments, the gate dielectric layer 420 is made of a high dielectric (high-k) material with a dielectric constant higher than that of silicon oxide. In some embodiments, the gate dielectric layer 420 is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof. In some embodiments, the gate dielectric layer 420 is deposited using an ALD process, a CVD process, other applicable processes, or a combination thereof. In some embodiments, a high temperature annealing process is performed to the gate dielectric layer 420. The high temperature annealing process may be used to reduce or eliminate defects in the gate dielectric layer 420. The high temperature annealing process may be short in duration and apply temperatures ranging from about 600 degrees C. to about 1200 degrees C.

As shown in FIG. 4C, a work function layer 422 is deposited over the gate dielectric layer 420, in accordance with some embodiments. The work function layer 422 provides desired work function for transistors to enhance device performance including improved threshold voltage. For example, the work function layer 422 is used as a p-type metal for enhancing the performance of a PMOS device to be formed on the region 402P. In some embodiments, the work function layer 422 is a p-type metal capable of providing a work function value suitable for the device, such as equal to or greater than about 4.8 eV. The p-type metal may include metal, metal carbide, metal nitride, other suitable materials, or combinations thereof. The thickness and/or the components of the work function layer 422 may be tuned to adjust the work function level of the work function layer 422.

Embodiments of the disclosure have many variations. In some embodiments, one or more interfacial layers are formed between the work function layer 422 and the gate dielectric layer 420. In some embodiments, the titanium nitride (TiN) layer (not shown) is formed between the work function layer 422 and the gate dielectric layer 420. In some embodiments, the work function layer 422 includes multiple layers.

Afterwards, a barrier metal layer 424 is deposited over the work function layer 422, as shown in FIG. 4C in accordance with some embodiments. In some embodiments, the barrier metal layer 424 is used to prevent metal penetration, such as aluminum penetration, from a metal filling layer (not shown) which may be subsequently formed and serve as an electrode.

As shown in FIG. 4C, a material layer 104' is deposited over the metal barrier layer 424 using a spin-on process (or a spin coating process), in accordance with some embodiments. In some embodiments, the materials and the formation methods of the material layer 104' are similar to those of the material layer 104. The material layer 104' may also be called a spin-on glass (SOG) layer. As shown in FIG. 4C, the material layer 104' fills the recesses 416N and 416P, in accordance with some embodiments.

Afterwards, the semiconductor substrate 400 is transferred into the apparatus 300A or 300B, in accordance with some embodiments. Afterwards, the material layer 104' is heated evenly and adequately by using the apparatus 300A or 300B. In some embodiments, the material layer 104' is simultaneously heated by multiple heaters around the semiconductor substrate 400. Both a surface portion and an inner portion of the material layer 104' are heated under substantially the same conditions. Therefore, it is easier to ensure that the surface portion of the material layer 104' is dry enough and the inner portion of the material layer 104' is not overheated.

Afterwards, a patterned photosensitive layer 426 is deposited and patterned over the material layer 104', as shown in FIG. 4C in accordance with some embodiments. In some embodiments, the materials and the formation methods of the photosensitive layer 426 are similar to those of the photosensitive layer 106 as shown in FIG. 1C. In some embodiments, a rinsing process similar to the rinsing process 107 is performed on the surface of the material layer 104' before the photosensitive layer 426 is formed. Because the material layer 104' is heated evenly and adequately, the rinsing process would not substantially change the profile of the material layer 104'.

Figure 4D:
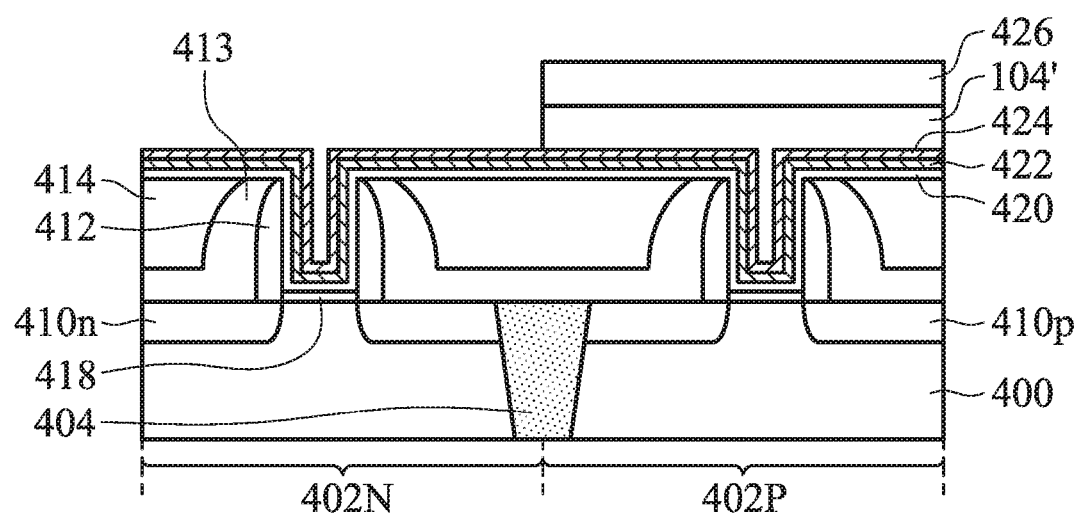

As shown in FIG. 4D, the material layer 104' is partially removed with the photosensitive layer 426 as a mask, in accordance with some embodiments. In some embodiments, the material layer 104 is partially removed by using an etching process or applying a suitable solution or solvent. Because the material layer 104' is heated evenly and adequately, the material layer 104' can be completely removed to expose the barrier metal layer 424 in the recess 416N. There is substantially no residue left in the recess 416N. Therefore, a subsequent removal process of the barrier metal layer 424 and the work function layer 422 become easier since no residue from the material layer 104' is left. Afterwards, suitable work function layer for an NMOS device may be formed in the recess 416N to serve as a metal gate.

Embodiments of the disclosure provide an apparatus for heating a semiconductor substrate. The apparatus includes an upper heater and a bottom heater to provide a sufficient and even heat treatment to a spin-on material layer over the semiconductor substrate. A ring-shaped heater is also used to surround the semiconductor substrate and further enhance the heat treatment. The apparatus includes a rotatable substrate holder which can rotate the semiconductor substrate while the heat treatment is performed by the top heater, the bottom heater, and/or the ring-shaped heater. Because the spin-on material layer is heated evenly, the quality of a subsequent patterning process of the spin-on material layer is significantly improved.

In accordance with some embodiments, a method for forming a semiconductor device structure is provided. The method includes spin coating a material layer over a semiconductor substrate. The method also includes heating the material layer by using a first heater above the semiconductor substrate and a second heater below the semiconductor substrate.

In accordance with some embodiments, a method for forming a semiconductor device structure is provided. The method includes forming gate electrodes over a semiconductor substrate and forming a dielectric layer over the semiconductor substrate to surround the gate electrodes. The method also includes removing the gate electrodes to form recesses in the dielectric layer and spin coating a material layer over the dielectric layer to fill the recesses. In addition, the method includes heating the material layer by using a first heater above the semiconductor substrate and a second heater under the semiconductor substrate.

In accordance with some embodiments, an apparatus for heating a semiconductor substrate is provided. The apparatus includes a substrate holder configured to hold a substrate. The apparatus also includes a first heater above the substrate holder and configured to heat the substrate. The apparatus further includes a second heater below the substrate holder and configured to heat the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

dispensing a film-forming liquid over a semiconductor substrate during or before the semiconductor substrate are spun by a first substrate holder of a spin coating apparatus to spin coating a material layer over the semiconductor substrate having an upper surface and an opposing lower surface;

supporting the semiconductor substrate with a second substrate holder of a heat treatment apparatus after the material layer is formed, the second substrate holder engaging the lower surface of the semiconductor substrate; and heating the material layer by using a first heater positioned above the upper surface of the semiconductor substrate, a second heater positioned below the lower surface of the semiconductor substrate, and a third heater surrounding a periphery of the semiconductor substrate, wherein the semiconductor substrate is spaced from the first heater by a first distance, spaced from the second heater by a second distance, and spaced from the third heater by a third distance, wherein the first distance is between the first heater and a first closest surface of the semiconductor substrate, the second distance is between the second heater and a second closest surface of the semiconductor substrate, and the third distance is between the third heater and a third closest surface of the semiconductor substrate, wherein the first distance, the second distance, and the third distance are substantially the same, wherein the semiconductor substrate and the material layer are heated by the first heater, the second heater, and the third heater in a closed chamber of the heat treatment apparatus, and the first heater, the second heater, and the third heater are positioned in the closed chamber, wherein the material layer is simultaneously heated by the first heater, the second heater, and the third heater while rotating the semiconductor substrate engaged by the second substrate holder, and wherein the semiconductor substrate is an only substrate positioned in the closed chamber of the heat treatment apparatus when the material layer is simultaneously heated by the first heater, the second heater, and the third heater while rotating the semiconductor substrate in the closed chamber.

2. The method as claimed in claim 1, wherein a top view of the third heater has a ring shape.

3. The method as claimed in claim 1, further comprising partially removing the material layer after the material layer is heated by the first heater, the second heater, and the third heater.

4. The method as claimed in claim 3, further comprising forming a patterned photosensitive layer over the material layer after the material layer is heated and before the material layer is partially removed.

5. The method as claimed in claim 4, further comprising rinsing the material layer after the material layer is heated and before the patterned photosensitive layer is formed.

6. The method as claimed in claim 1, further comprising:
    forming a plurality of recesses in or over the semiconductor substrate before the material layer is spin coated, wherein the material layer fills the recesses;
    forming a patterned photosensitive layer over the material layer after the material layer is heated by the first heater and the second heater; and
    partially removing the material layer such that at least one of the recesses is exposed after the patterned photosensitive layer is formed.

7. A method for forming a semiconductor device structure, comprising:
    forming gate electrodes over a semiconductor substrate having an upper surface and an opposing lower surface;
    forming a dielectric layer over the semiconductor substrate to surround the gate electrodes;
    removing the gate electrodes to form recesses in the dielectric layer;
    forming a material layer over the dielectric layer to fill the recesses;
    supporting the semiconductor substrate with a substrate holder of a heat treatment apparatus, the substrate holder engaging the lower surface of the semiconductor substrate; and
    heating the material layer by using a first heater positioned above the upper surface of the semiconductor substrate, a second heater positioned below the lower surface of the semiconductor substrate, and a third heater surrounding a periphery of the semiconductor substrate, wherein the semiconductor substrate is spaced from the first heater by a first distance, spaced from the second heater by a second distance, and spaced from the third heater by a third distance, wherein the first distance is between the first heater and a first closest surface of the semiconductor substrate, the second distance is between the second heater and a second closest surface of the semiconductor substrate, and the third distance is between the third heater and a third closest surface of the semiconductor substrate, wherein the first distance, the second distance, and the third distance are substantially the same, wherein the semiconductor substrate and the material layer are heated by the first heater, the second heater, and the third heater in a closed chamber of the heat treatment apparatus, and the first heater, the second heater, and the third heater are positioned in the closed chamber, wherein the material layer is simultaneously heated by the first heater, the second heater, and the third heater while rotating the semiconductor substrate engaged by the substrate holder, and wherein the semiconductor substrate is an only substrate positioned in the closed chamber of the heat treatment apparatus when the material layer is simultaneously heated by the first heater, the second heater, and the third heater while rotating the semiconductor substrate in the closed chamber.

8. The method as claimed in claim 7, further comprising patterning the material layer after the material layer is heated by the first heater, the second heater, and the third heater.

9. A method for forming a semiconductor device structure, comprising:
    forming a material layer over a substrate having a horizontal upper surface, a horizontal lower surface and vertical sidewalls extending between the upper surface and the lower surface;
    supporting the substrate with a substrate holder of a heat treatment apparatus, the substrate holder engaging the lower surface of the substrate; and
    heating the material layer by using a first heater, a second heater, and a third heater surrounding a periphery of the semiconductor substrate, wherein the semiconductor substrate is spaced from the first heater by a first distance, spaced from the second heater by a second distance, and spaced from the third heater by a third distance, wherein the first distance is between the first heater and a first closest surface of the semiconductor substrate, the second distance is between the second heater and a second closest surface of the semiconductor substrate, and the third distance is between the third heater and a third closest surface of the semiconductor substrate, wherein the first distance, the second distance, and the third distance are substantially the same, wherein the semiconductor substrate and the material layer are heated by the first heater, the second heater, and the third heater in a closed chamber of the heat treatment apparatus, and the first heater, the second heater, and the third heater are positioned in the closed chamber, wherein the material layer is simultaneously heated by the first heater, the second heater, and the third heater while rotating the substrate engaged by the substrate holder, and wherein the semiconductor substrate is an only substrate positioned in the closed chamber of the heat treatment apparatus when the material layer is simultaneously heated by the first heater, the second heater, and the third heater while rotating the semiconductor substrate in the closed chamber.

10. The method as claimed in claim 9, wherein the first heater and the second heater provide thermal energy to the material layer from opposite directions.

11. The method as claimed in claim 9, further comprising rinsing the material layer after the material layer is heated.

12. The method as claimed in claim 1, wherein the third distance is in a range from about 0.5 cm to about 100 cm.

13. The method as claimed in claim 9, wherein the first distance is in a range from about 0.5 cm to about 100 cm.

14. The method as claimed in claim 7, further comprising:
    forming a gate dielectric layer over bottoms and sidewalls of the recesses before the material layer is formed; and
    forming a work function layer over the gate dielectric layer before the material layer is formed.

15. The method as claimed in claim 14, further comprising partially removing the material layer after the material layer is heated by the first heater, the second heater, and the third heater, wherein the material layer is not in one of the recesses after the material layer is partially removed.

16. The method as claimed in claim 15, further comprising rinsing the material layer after the material layer is heated by the first heater, the second heater, and the third heater and before the material layer is partially removed.

17. The method as claimed in claim 7, wherein the material layer is deposited using a spin-on process.

18. The method as claimed in claim 7, wherein the first heater provides a first thermal energy to the material layer, the second heater provides a second thermal energy to the material layer, and the second thermal energy is higher than the first thermal energy.

19. The method as claimed in claim 18, wherein the third heater provides a third thermal energy to the material layer, and the third thermal energy is higher than the second thermal energy.

20. The method as claimed in claim 1, wherein the first heater provides a first thermal energy to the material layer, the second heater provides a second thermal energy to the material layer, and the second thermal energy is higher than the first thermal energy.

* * * * *